(12) United States Patent
Arnborg et al.

(10) Patent No.: US 7,391,080 B2
(45) Date of Patent: Jun. 24, 2008

(54) LDMOS TRANSISTOR DEVICE EMPLOYING SPACER STRUCTURE GATES

(75) Inventors: Torkel Arnborg, Stockholm (SE); Ulf Smith, Huddinge (SE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 10/968,633

(22) Filed: Oct. 19, 2004

(65) Prior Publication Data

US 2005/0110080 A1    May 26, 2005

(30) Foreign Application Priority Data

Nov. 21, 2003 (SE) .................................. 0303106

(51) Int. Cl.
    *H01L 29/76*       (2006.01)
(52) U.S. Cl. .................. 257/335; 257/288; 257/336; 257/337; 257/334; 257/341
(58) Field of Classification Search ............... 257/335, 257/328, E29.261, E29.256, E29.066, 288, 257/336, 337, 344, 341, 350, 401, 408
    See application file for complete search history.

(56) References Cited

U.S. PATENT DOCUMENTS

| | | | | |
|---|---|---|---|---|
| 4,574,208 A * | 3/1986 | Lade et al. | ................... | 327/389 |
| 5,041,895 A * | 8/1991 | Contiero et al. | ............. | 257/370 |
| 5,548,133 A * | 8/1996 | Kinzer | ....................... | 257/155 |
| 5,969,383 A | 10/1999 | Chang et al. | ................. | 257/316 |
| 6,025,237 A * | 2/2000 | Choi | ........................... | 438/301 |
| 6,248,633 B1 * | 6/2001 | Ogura et al. | ................. | 438/267 |
| 6,329,687 B1 * | 12/2001 | Sobek et al. | ................. | 257/314 |
| 6,506,648 B1 * | 1/2003 | Hebert et al. | ............... | 438/286 |
| 2002/0055220 A1 | 5/2002 | Soderbarg et al. | ........... | 438/234 |
| 2002/0140022 A1 | 10/2002 | Lin et al. | ..................... | 257/315 |
| 2002/0149021 A1 * | 10/2002 | Casady et al. | ................. | 257/77 |
| 2004/0201078 A1 * | 10/2004 | Ren | ........................... | 257/500 |
| 2005/0106825 A1 * | 5/2005 | You et al. | .................... | 438/301 |

FOREIGN PATENT DOCUMENTS

JP              60144976           7/1985
JP              09121053           5/1997

* cited by examiner

*Primary Examiner*—Evan Pert
*Assistant Examiner*—Tan Tran
(74) *Attorney, Agent, or Firm*—Schwegman, Lundberg & Woessner, P.A.

(57) ABSTRACT

An integrated LDMOS transistor comprises a semiconductor substrate (11), an LDMOS gate region (17), LDMOS source (14) and drain (15) regions, and a channel region (13) arranged beneath the LDMOS gate region, where the channel region interconnects the LDMOS source and drain regions. The LDMOS gate region comprises first (18a) and second (18b) gate insulation layer regions, a centrally located gate-dividing insulation region (19) provided between the first and second gate insulation layer regions, and first (20a) and second (20b) individual gate conducting layer regions, each being provided on top of a respective one of the first and second gate insulation layer regions, and each being an etched outside spacer region at the centrally located insulation layer region.

14 Claims, 5 Drawing Sheets

LDMOS TRANSISTOR DEVICE EMPLOYING SPACER STRUCTURE GATES

PRIORITY

This application claims priority to Swedish application No. 0303106-9 filed Nov. 21, 2003.

TECHNICAL FIELD OF THE INVENTION

The present invention generally relates to the field of integrated circuit technology, and more specifically the invention relates to an LDMOS (lateral double diffused MOS) transistor device, to an integrated circuit including the LDMOS transistor device, and to a fabrication method of the integrated circuit with the LDMOS transistor device, respectively.

DESCRIPTION OF RELATED ART AND BACKGROUND OF THE INVENTION

The speed of an LDMOS transistor is determined by the transconductance $g_m$ and the input capacitance $C_{in}$, and more specifically, the speed is proportional to $g_m/C_{in}$. By reducing the capacitance without changing the transconductance, the speed is increased with no additional drawbacks assuming that the process lithography is maintained unaffected.

An improved performance using a scaled down device with a channel length shorter than the smallest mask dimensions that process lithography of today permits, has been obtained in several manners. One common method is to use a diffusion step that defines a critical length such as the channel length or the length of the gate, see e.g. the published U.S. patent application Ser. No. 20020055220 A1.

SUMMARY OF THE INVENTION

Some prior art solutions do not take the full improvement potential into account. For instance, some of the prior art LDMOS transistors of the above-mentioned kind have still an unnecessary high input capacitance and thereby an unnecessary low speed.

Still some prior art solutions for LDMOS transistors, such as the one depicted in the U.S. patent application, need additional process steps for fabrication of devices with sub-lithographic feature sizes.

Accordingly, it is an object of the present invention to provide an LDMOS transistor device in an integrated circuit, particularly an integrated circuit for radio frequency applications, which LDMOS transistor device overcomes the problems associated with the prior art described above.

Further, it is an object of the invention to provide an integrated circuit comprising such an LDMOS transistor device.

Still further, it is an object of the invention to provide a method in the fabrication of an integrated circuit, particularly an integrated circuit for radio frequency applications, including an LDMOS transistor, which accomplishes the above object.

These objects can, according to the present invention, be attained by an LDMOS transistor device in an integrated circuit, particularly an integrated circuit for radio frequency applications, comprising a semiconductor substrate, an LDMOS gate region on top of the substrate, LDMOS source and drain regions, and a channel region arranged in the substrate beneath the LDMOS gate region, the channel region interconnecting the LDMOS source and drain regions, wherein the LDMOS gate region comprises first and second gate insulation layer regions, a centrally located insulation layer region provided between the first and second gate insulation layer regions, and first and second gate conducting layer regions, each of which being provided on top of a respective one of the first and second gate insulation layer regions, each being an etched outside spacer region at the centrally located insulation layer region, and each having a length which is smaller than a length of the centrally located insulation layer region.

The first and second gate conducting layer regions can be provided with individual contacts for electric connection. The channel region can be located at least partly directly beneath one of the first and second gate conducting layer regions, and a drain drift region can be located at least partly directly beneath another one of the first and second gate conducting layer regions. One of the first and second gate conducting layer regions can be connected to a control voltage, and the another one of the first and second gate conducting layer regions can be connected to a bias voltage, preferably high bias voltage, to invert channel carriers in the drain drift region. The first and second gate conducting layer regions can each be made of doped polycrystalline silicon. The first and second gate conducting layer regions can be silicided, particularly nickel silicided. The LDMOS transistor device can be a radio frequency power transistor. A monolithically integrated circuit may comprise the LDMOS transistor device.

The object can also be achieved by a method in the fabrication of a monolithically integrated circuit including an LDMOS transistor device comprising the steps of providing a semiconductor substrate, forming an LDMOS gate region on top of the substrate, forming LDMOS source and drain regions, and forming a channel region arranged in the substrate beneath the LDMOS gate region, the channel region interconnecting the LDMOS source and drain regions, wherein the step of forming an LDMOS gate region on top of the substrate comprises the steps of forming a centrally located insulation layer region, forming first and second gate insulation layer regions on opposite sides of the centrally located insulation layer region, depositing conformally a layer of a conducting material on top of the centrally located insulation layer region and the first and second gate insulation layer regions, and etching anisotropically the conformally deposited layer of a conducting material to form first and second gate conducting layer regions in the shape of outside spacer regions on top of the first and second gate insulation layer regions and on opposite sides of the centrally located insulation layer region.

The centrally located insulation layer region can be formed with a first length, and each of the first and second gate conducting layer regions can be formed with a second length, the first length being larger than the second length. The centrally located insulation layer region can be formed by depositing a layer of an insulating material, and etching the layer of an insulating material. The conducting material can be a doped, preferably heavily doped, semiconducting material, particularly polycrystalline silicon. Layouts of the outside spacer regions can be set by masking and isotropic etching of the layer of the conducting material. The outside spacer regions can be silicided, particularly nickel silicided. The LDMOS source and drain regions can be silicided simultaneously with the silicidation of the outside spacer regions. First and second contact regions, particularly made of doped, preferably heavily doped, semiconducting material, particularly polycrystalline silicon, can be formed, each of which being connected to a respective one of the outside spacer regions. The monolithically integrated circuit can be metallized, and each of the first and second contact regions can be connected individually during the metallization.

By providing an LDMOS transistor device in an integrated circuit, particularly an integrated circuit for radio frequency applications, comprising a novel split gate structure the gate length is considerably decreased, thereby reducing the input capacitance and increasing the speed of the LDMOS transistor device.

The novel split gate structure comprises first and second gate insulation layer regions, a centrally located insulation layer region provided between the first and second gate insulation layer regions, and first and second gate conducting layer regions provided on top of the first and second gate insulation layer regions. The first and second gate conducting layers are etched outside spacer regions at opposite sides of the centrally located insulation layer region, and each has a length which is smaller, preferably much smaller, than a length of the centrally located insulation layer region. Preferably, the length of the centrally located insulation layer region is set by a mask, whereas the gate lengths are shorter than the smallest mask dimensions that typical process lithography of today permits.

Still preferably, the first and second gate conducting layer regions of the LDMOS transistor device are provided with individual contacts for electric connection. In this way one of the first and second gate conducting layer regions can be connected to a control voltage, and the another one of the first and second gate conducting layer regions can be connected to a bias voltage, preferably high bias voltage, to invert channel carriers in the drain drift region of the LDMOS transistor device.

Further, a method of producing the inventive LDMOS transistor comprises the steps of forming a centrally located insulation layer region on top of a semiconductor substrate, preferably by means of masking and etching, forming first and second gate insulation layer regions on opposite sides of the centrally located insulation layer region, depositing conformally a layer of a conducting material on top of the centrally located insulation layer region and the first and second gate insulation layer regions, and etching anisotropically the conformally deposited layer of a conducting material to form first and second gate conducting layer regions in the shape of outside spacer regions on top of the first and second gate insulation layer regions and on opposite sides of the centrally located insulation layer region.

By the fabrication method of the present invention a small feature size device having a gate length is produced using process steps that are typically already included in state-of-the-art BiCMOS and CMOS processes.

Further characteristics of the invention and advantages thereof will be evident from the detailed description of preferred embodiments of the present invention given hereinafter and the accompanying FIGS. 1-10, which are given by way of illustration only, and thus are not limitative of the present invention.

BRIEF DESCRIPTION OF THE DRAWINGS

Identical reference numerals are used throughout the Figures to denote identical or similar components, portions, details and the like of the various embodiments.

DETAILED DESCRIPTION OF PREFERRED EMBODIMENTS

Figure 1:
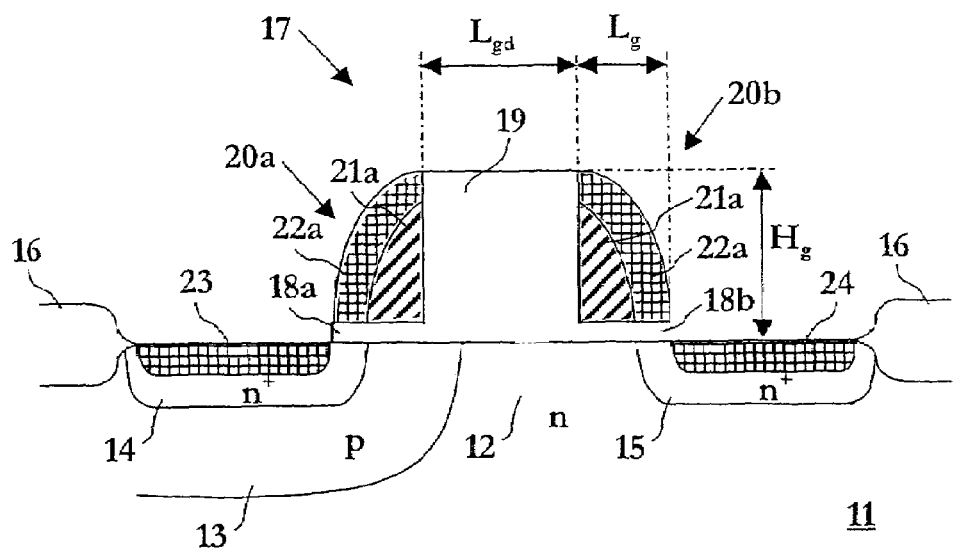
FIG. 1 is a highly enlarged cross-sectional view of a monolithically integrated LDMOS transistor according to a preferred embodiment of the present invention.

A silicon LDMOS transistor according to a first preferred embodiment of the present invention is shown in FIG. 1 in an enlarged cross-sectional view. The LDMOS transistor, which is particularly adapted for high power radio frequency applications, comprises a semiconductor substrate 11, in which $n^{31}$-type doped drain drift 12, p-type doped channel pocket 13, $n^+$-type doped source 14, and $n^+$-type doped drain 15 regions are formed. The doped regions 12-15 in the substrate 11 are laterally surrounded by field oxide 16 or other kind of insulation areas, such as e.g. shallow trench isolation (STI) regions.

An inventive LDMOS gate structure 17 is arranged on top of the substrate 11. The gate structure 17 includes a centrally located split gate-dividing separator 19 of an electrically insulating material and a first 18a and a second 18b gate insulation layer region on a respective side of the split gate-dividing separator 19. The split gate-dividing separator 19 has a length $L_{gd}$ and a height $h_g$, which are of comparable size, typically in the interval 0.5-1 micron.

A first 20a and second 20b gate conducting layer region, preferably of doped polycrystalline silicon, are arranged on top of the first 18a and second 18b gate insulation layer regions, where each of the gate conducting layer regions 20a-b is an etched outside spacer region adjacent to the centrally located split gate-dividing separator 19. Further, each of the gate conducting layer regions 20a-b has a length $L_g$ which is smaller to much smaller than the length $L_{gd}$ of the centrally located split gate-dividing separator 19. The gate length $L_{gd}$ may preferably be less than 0.5 microns, more preferably less than 0.2 microns, and most preferably less than 0.1 microns such as e.g. about 50-70 nm. Thus, the gate length can be made much shorter than in conventional LDMOS transistors with lithographically defined gates.

The channel pocket region 13 is located at least partly directly beneath one 20a of the gate conducting layer regions, and the drain drift region 12 is located at least partly directly beneath the other one 20b of the gate conducting layer regions.

Preferably, the first and second gate conducting layer regions 20a-b and the source 14 and drain 15 regions are silicided. Thus, each of the first and second gate outside spacer regions 20a-b consists of a silicon region 21a-b, and a silicide region 22a-b thereupon. The source and drain silicide regions are denoted 23 and 24.

The gate conducting layer regions 20a-b are provided with individual contacts for electric connection. Preferably, the gate conducting layer region 20a closest to the source 14 is connected to a control voltage for the ordinary gate function, and the gate conducting layer region 20b closest to the drain 15 is connected to a bias voltage, preferably high bias voltage, to invert channel carriers as much as possible below and beside itself in the drain drift region 12. Further, the drain drift region 12 should preferably be heavier doped than a drain drift region of a corresponding single gate transistor to ensure, together with the bias voltage of the gate conducting layer region 20b closest to the drain 15, that the channel carriers are inverted at control voltages above threshold.

An adequate spacing between the gate conducting layer regions 20a-b should advantageously be ensured to essentially avoid capacitive coupling between the gate conducting layer regions 20a-b. Thus, the separation is preferably larger than the thickness of the gate insulation layer regions 18a-b.

Figure 2:
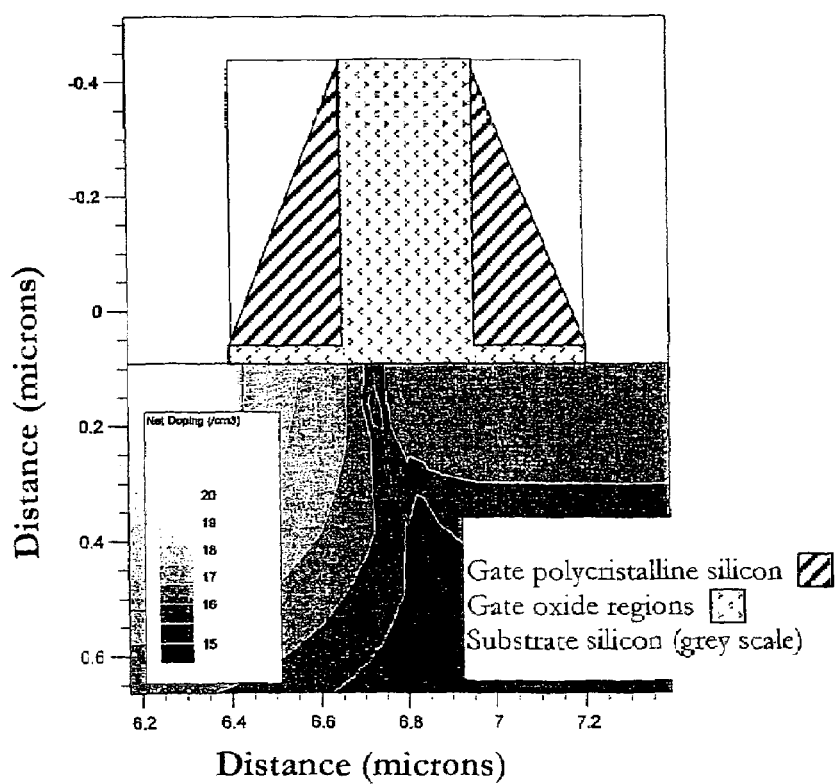
FIG. 2 illustrates typical doping concentrations in the substrate below the gate structure of an inventive LDMOS transistor, such as the one illustrated in FIG. 1.

A typical doping concentration distribution of the various regions in the substrate of the inventive double spacer gate LDMOS transistor is illustrated in FIG. 2. Also, typical feature dimensions of the transistor are indicated. The dashed lines indicate the source-channel and channel-drain pn-junctions.

Figure 3:
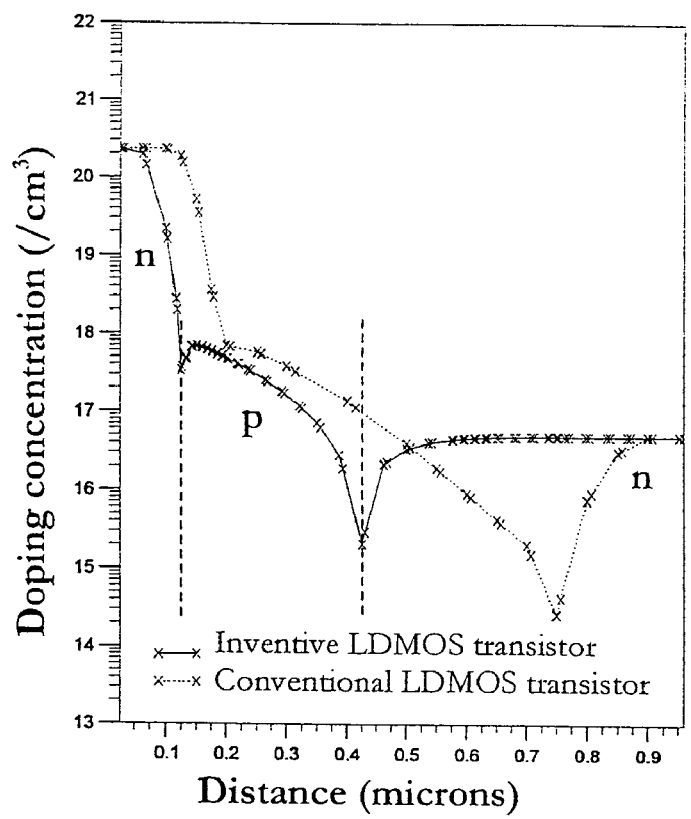
FIGS. 3-6 are diagrams illustrating various simulated transistor characteristics of an inventive LDMOS transistor, such as the one illustrated in FIG. 1, as compared to a conventional LDMOS transistor.

The horizontal channel doping concentration distributions of the inventive double spacer gate LDMOS transistor and of a conventional prior art LDMOS transistor are illustrated in FIG. 3. Ignoring the different locations of sources of the two LDMOS transistors it can be seen that the part of the doping concentration distribution determining the threshold voltage has the same peak value giving same threshold voltage $V_T$ in both cases.

Figure 4:
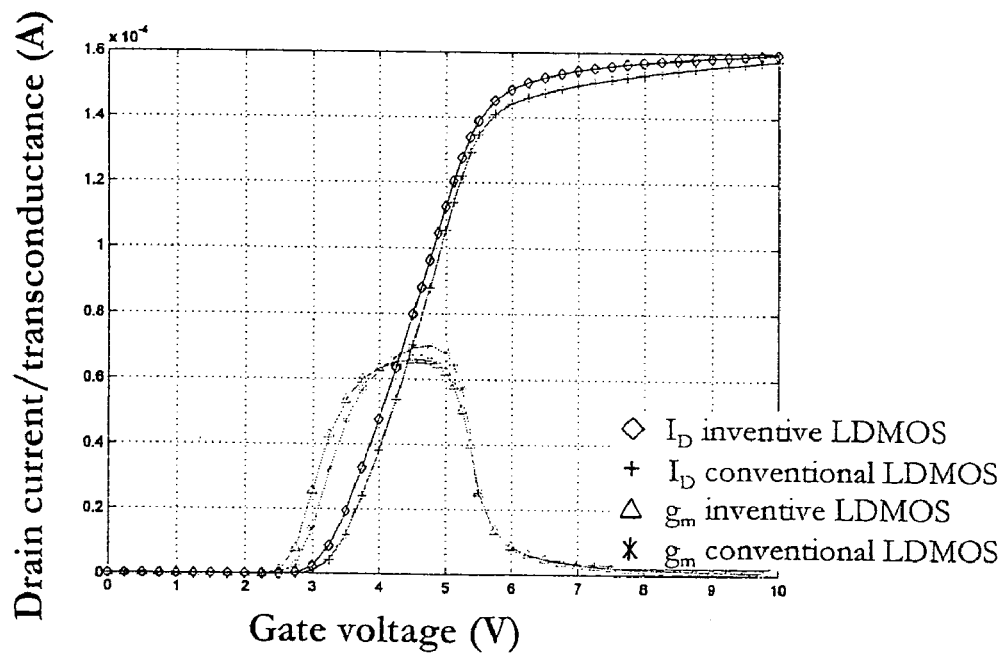

Drain current and transconductance, respectively, versus gate voltage at a drain bias voltage $V_{DS}$=10 V for the inventive double spacer gate LDMOS transistor and for the conventional prior art LDMOS transistor are illustrated in FIG. 4. It can here be seen that the transistors have the same threshold voltage $V_T$.

Figure 5:
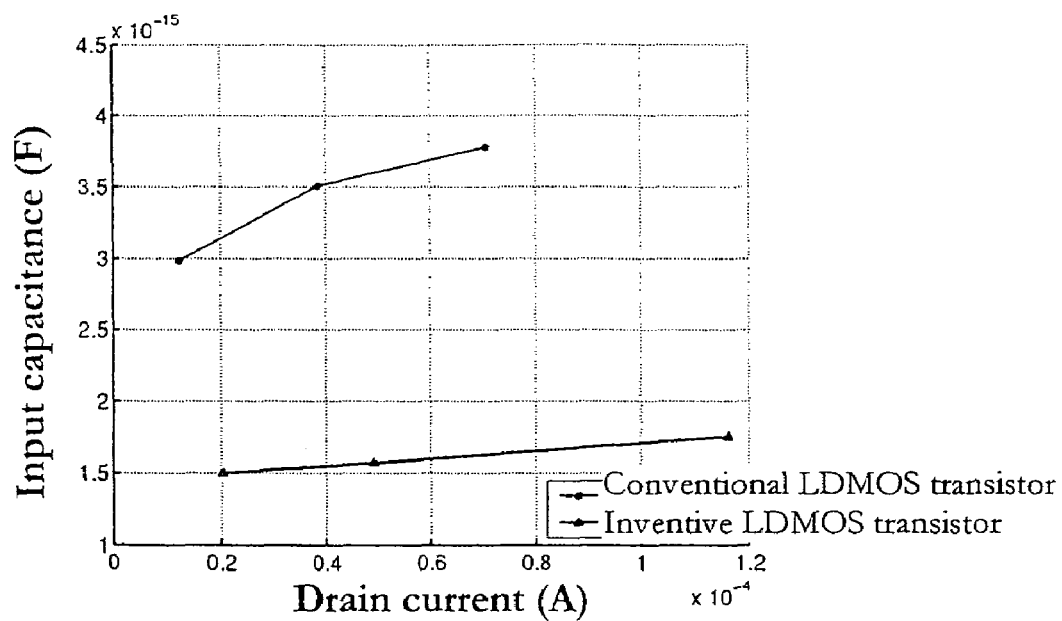
Figure 6:
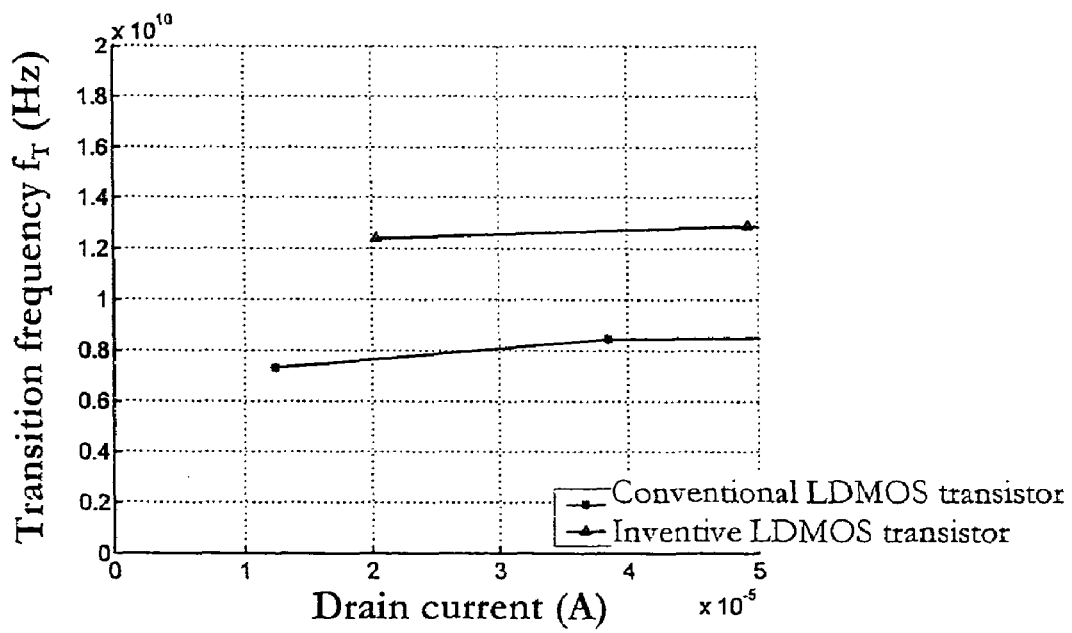

The input capacitance and the unity gain frequency $f_T$, respectively, versus drain current for the inventive double spacer gate LDMOS transistor and for a conventional prior art LDMOS transistor are illustrated in FIGS. 5-6. From FIG. 5 it can be seen that the input capacitance is about a factor two lower for the inventive double spacer gate LDMOS transistor. The combination of an unchanged transconductance and a reduced capacitance gives an improved gain and a corresponding increased unity gain transition frequency $f_T$. From FIG. 6 it can be seen that the unity gain transition frequency $f_T$ is about a factor two higher for the inventive double spacer gate LDMOS transistor.

It shall further be appreciated that while the illustrated preferred embodiments of the LDMOS transistor are n-channel devices, the present invention is not limited in this respect. The invention is equally applicable to p-channel devices.

It shall yet further be appreciated that while the present invention is primarily intended for radio frequency power silicon LDMOS devices, it may as well be useful for smaller devices in silicon-based integrated radio frequency circuits. Further, the double spacer gate LDMOS transistors of the present invention may be realized in other materials such as e.g. SiC, GaAs, etc.

Below, a preferred embodiment for manufacturing an integrated LDMOS transistor of the present invention is described with reference to FIGS. 7-10. The fabrication may be performed in a BiCMOS process or in a pure CMOS process. Many of the steps in the process, e.g. including ion implanting steps for forming wells and source and drain regions, are well known to the person skilled in the art and these steps will therefore not be described at all here, or will only be schematically indicated. The main focus is put on how the gate structure of the LDMOS transistor is formed.

Figure 7:
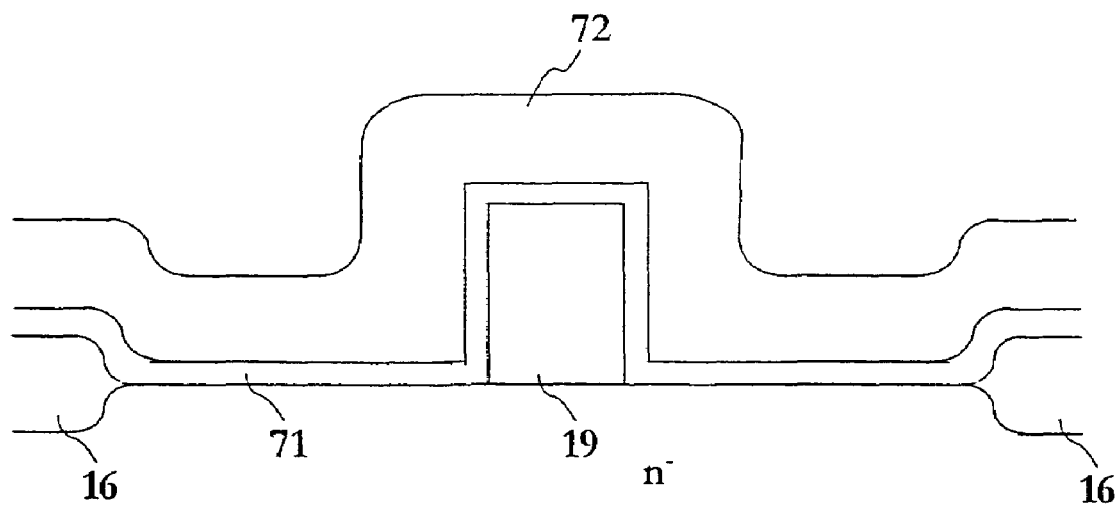
FIGS. 7-10 are highly enlarged cross-sectional views of a portion of a semiconductor structure during processing according to a further preferred embodiment of the present invention.

Field oxide regions 16 are formed in the surface of a semiconductor substrate 11 having an upper portion doped to n−type. The field oxide regions 16 are formed to surround, in a horizontal dimension, the LDMOS transistor. A rather thick layer of silicon oxide is deposited on top of the substrate 11, and is then patterned and etched to form a centrally located split gate-dividing separator 19. A thin gate oxide layer 71 is then deposited on the structure, and this is followed by a deposition of a conformal polycrystalline silicon layer 72 for the inventive double spacer gate structure of the LDMOS transistor. The conformal polycrystalline silicon layer 72 is preferably heavily doped to ensure adequate conductivity in the resulting gate structure. A cross-section of the resulting structure is illustrated in FIG. 7.

Note that the height of the split gate-dividing structure is equal to the sum of the thickness of the thick layer of silicon oxide to form the split gate-dividing separator 19 and the thickness of the thin gate oxide layer 71, and that the length of split gate-dividing structure is equal to the sum of the length of the thick layer of silicon oxide to form the split gate-dividing separator 19 and two times the thickness of the thin gate oxide layer 71. The deposited thickness and etching of the thick layer of silicon oxide to form the split gate-dividing separator 19 are selected accordingly.

Figure 8:
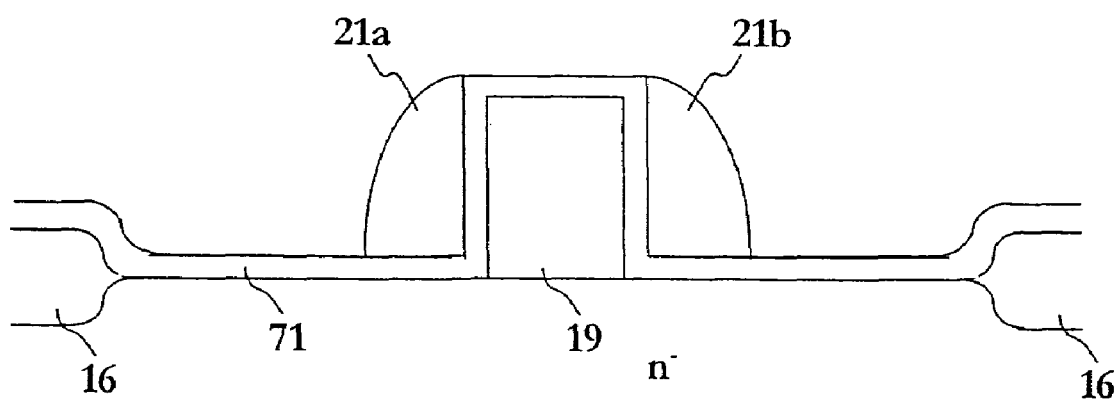

The conformally deposited polycrystalline silicon layer 72 is subsequently etched anisotropically to form first and second gate conducting layer regions in the shape of outside spacer regions 21a-b on top of the thin gate oxide layer 71 and on opposite sides of the centrally located split gate-dividing separator 19. The etching is selective with respect to the underlying gate oxide layer 71. A cross-section of the resulting structure is illustrated in FIG. 8.

Figure 9:
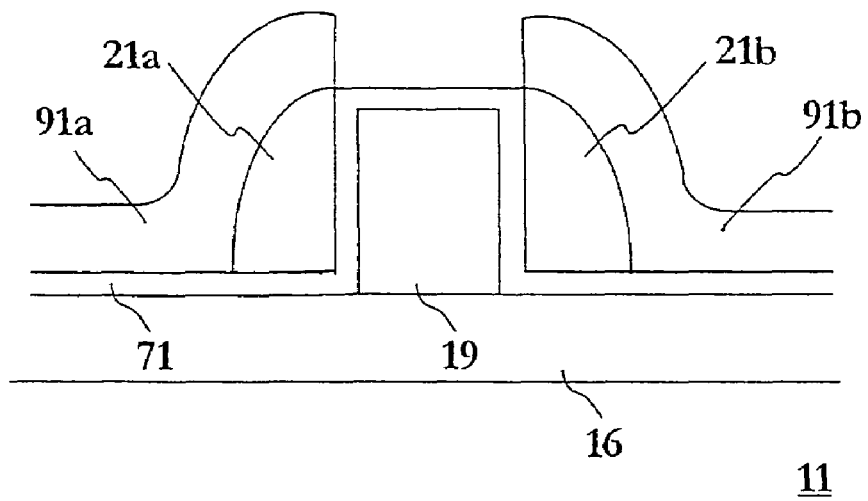

In order to create contacts for the outside spacer regions 21a-b the anisotropic etch is performed through a mask (not illustrated) to thereby form polycrystalline silicon contact regions 91a-b on top of extensions of the outside spacer regions 21a-b at an area outside the substrate area for the LDMOS transistor, where field oxide 16 has been created. A cross-section of such a structure is illustrated in FIG. 9. The polycrystalline silicon contact regions 91a-b may later, during metallization of the structure, be connected individually to metallic layers (not illustrated) of the structure. The masking and etching for formation of the polycrystalline silicon contact regions 91a-b, or other masking and etching, are used to define the layout of the outside spacer regions 21a-b and to secure that they will be electrically insulated from each other.

Figure 10:
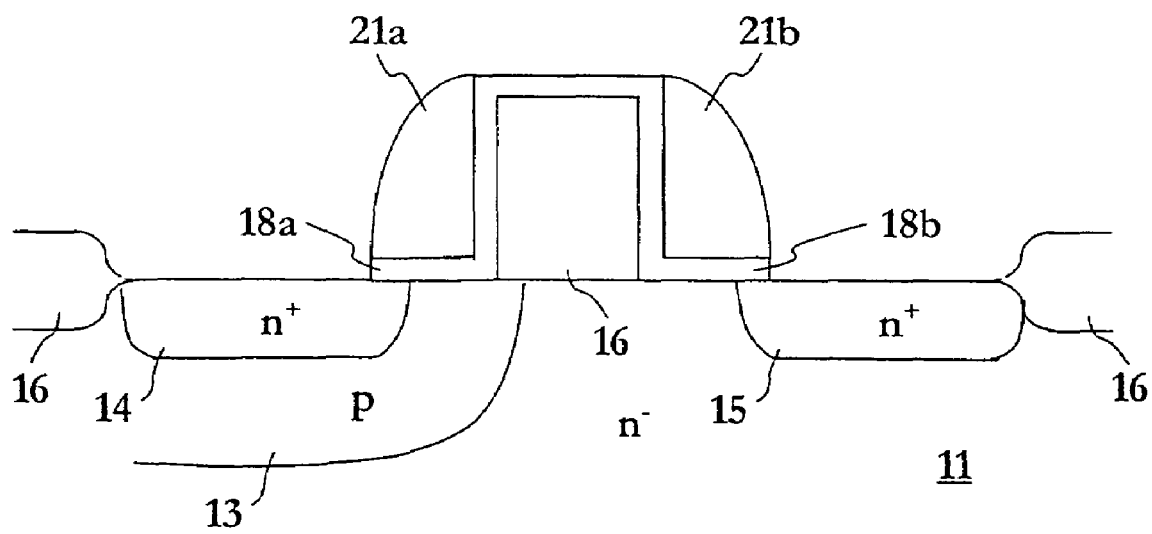

The thin gate oxide layer 71 is then etched, using the outside spacer regions 21a-b as a mask, to form first 18a and second 18b gate oxide layer regions. The substrate dopings, which have not been performed earlier in the process, are performed by ion implantation to form a channel pocket 13, source 14, and drain 15 regions. A cross-section of the resulting structure is illustrated in FIG. 10.

The process continues with silicidation of the outside spacer gate regions 21a-b and of the source 14 and drain 15 regions to obtain a structure like the one illustrated in FIG. 1. Note that the polycrystalline silicon contact regions 91a-b, but not the extensions of the outside spacer regions 21a-b below the polycrystalline silicon contact regions 91a-b are nickel silicided concurrently.

Preferably, nickel, platinum, or palladium is used for silicidation. Since these atoms move essentially into the silicon during silicidation, there is no risk for bridging between the source 14 or drain 15 region and the outside spacer gate regions 21a-b. Note that this is in contrast to some other common silicide metals, such as titanium and cobalt, where the silicon atoms move into the metal during the silicidation. In this case, the silicide might creep up and across the oxide, thereby causing short circuit between the source 14 or drain 15 region and the outside spacer gate regions 21a-b. However, in applications where there is no risk of such short-circuiting, titanium or cobalt may equally well be used for the silicidation.

After the formation of the silicide, the source 14 and drain 15 regions and the polycrystalline silicon contact regions 91a-b can be contacted during the metallization of the device.

We claim:

1. An LDMOS transistor device, comprising:
    a semiconductor substrate,
    an LDMOS gate region on top of said substrate, which comprises:
        first and second gate insulation layer regions,
        a centrally located insulation layer region provided between said first and second gate insulation layer regions, and
        a first and a second gate conducting layer region, each of which being provided on top of a respective one of said first and second gate insulation layer regions, each being a spacer formed adjacent to a respective sidewall of said centrally located insulation layer region, and each having a length which is less than a length of said centrally located insulation layer region, said first and said second gate conducting layer regions being provided with individual contacts for electric connection; LDMOS source and drain regions, and
    a channel region arranged in said substrate beneath said LDMOS gate region, wherein said channel region is located at least partly directly beneath one of said first and second gate conducting layer regions, and a drain drift region is located at least partly directly beneath another one of said first and said second gate conducting layer region, said channel region interconnecting said LDMOS source and drain regions.

2. The LDMOS transistor device of claim 1, wherein said one of said first and second gate conducting layer regions is connected to a control voltage, and said another one of said first and second gate conducting layer regions is connected to a bias voltage, preferably high bias voltage, to invert channel carriers in said drain drift region.

3. The LDMOS transistor device of claim 1, said first and second gate conducting layer regions are each made of doped polycrystalline silicon.

4. The LDMOS transistor device of claim 1, wherein said LDMOS transistor device is a radio frequency power transistor.

5. A monolithically integrated circuit comprising the LDMOS transistor device of claim 1.

6. An LDMOS transistor device, comprising:
    a semiconductor substrate,
    an LDMOS gate region on top of said substrate,
    LDMOS source and drain regions, and
    a channel region arranged in said substrate beneath said LDMOS gate region, said channel region interconnecting said LDMOS source and drain regions, wherein said LDMOS gate region comprises:
    first and second gate insulation layer regions,
    a centrally located insulation layer region provided between said first and second gate insulation layer regions, and
    first and second gate conducting layer regions, each of which being provided on top of a respective one of said first and second gate insulation layer regions, each being an etched outside spacer region at said centrally located insulation layer region, and each having a length which is smaller than a length of said centrally located insulation layer region;
    wherein said first and second gate conducting layer regions are each made of doped polycrystalline silicon; and
    wherein said first and second gate conducting layer regions are silicided and wherein said silicided first and second gate conducting layer regions are nickel silicided.

7. The LDMOS transistor device of claim 6, wherein the lengths of the first and second gate conducting regions are less than 0.5 microns.

8. The LDMOS transistor device of claim 6, wherein the lengths of the first and second gate conducting regions are less than 0.2 microns.

9. The LDMOS transistor device of claim 6, wherein the lengths of the first and second gate conducting regions are less than about 50 to 70 nanometers.

10. A device, comprising:
    a semiconductor substrate,
    a source, a drain and a gate arranged on said substrate to provide a channel region in the substrate adjacent one of first and second gate regions and to provide a drain drift region adjacent the other of the first and second gate regions, said channel region interconnecting said source and drain regions,
    wherein said gate regions further includes:
        first and second gate insulation layer regions above at least a portion of the first and second gate regions,
        a centrally located insulation layer region between said first and second gate insulation layer regions and having upwardly extending sidewalls, and
        first and second gate conducting layer regions, each of which is above a respective one of said first and second gate insulation layer regions, each formed adjacent to a respective sidewall of said centrally located insulation layer region, and each having a length in the plane of the substrate from the respective sidewall of the centrally located insulation region which is shorter than the length of said centrally located insulation layer region above the substrate,
    wherein said first and second gate conducting layer regions are silicided and wherein said silicided first and second gate conducting layer regions are nickel silicided.

11. The device of claim 10, wherein said one of said first and second gate conducting layer regions is connected to a control voltage, and said another one of said first and second gate conducting layer regions is connected to a bias voltage, to invert channel carriers in said drain drift region.

12. The device of claim 10, said first and second gate conducting layer regions are each made of doped polycrystalline silicon.

13. The device of claim 10, wherein said device is a radio frequency power transistor.

14. A monolithically integrated circuit comprising the device of claim 10.

* * * * *

UNITED STATES PATENT AND TRADEMARK OFFICE
CERTIFICATE OF CORRECTION

PATENT NO.        : 7,391,080 B2
APPLICATION NO.   : 10/968633
DATED             : June 24, 2008
INVENTOR(S)       : Arnborg et al.

It is certified that error appears in the above-identified patent and that said Letters Patent is hereby corrected as shown below:

In column 4, line 17, delete "$n^{31}$-type" and insert -- n-type --, therefor.

In column 8, line 49, in Claim 11, after "voltage" delete ",".

Signed and Sealed this

Second Day of September, 2008

JON W. DUDAS
*Director of the United States Patent and Trademark Office*